United States Patent
Mahate et al.

(10) Patent No.: US 9,418,183 B2
(45) Date of Patent: Aug. 16, 2016

(54) MODEL DEVELOPMENT ENVIRONMENT FOR ASSISTING USER IN DEVELOPING MODEL DESCRIBING CONDITION OF INDUSTRIAL ASSET

(71) Applicant: ABB Research Ltd., Zurich (CH)

(72) Inventors: Shakeel M. Mahate, Raleigh, NC (US); Paul F. Wood, Rocklin, CA (US); Karen J. Smiley, Raleigh, NC (US)

(73) Assignee: ABB Research Ltd., Zurich (CH)

( * ) Notice: Subject to any disclaimer, the term of this patent is extended or adjusted under 35 U.S.C. 154(b) by 558 days.

(21) Appl. No.: 13/913,926

(22) Filed: Jun. 10, 2013

(65) Prior Publication Data
US 2014/0365190 A1    Dec. 11, 2014

(51) Int. Cl.
| | | |
|---|---|---|
| *G06G 7/48* | (2006.01) | |
| *G06F 17/50* | (2006.01) | |
| *G05B 17/02* | (2006.01) | |
| *G05B 23/02* | (2006.01) | |
| *G06F 9/44* | (2006.01) | |

(52) U.S. Cl.
CPC ............ *G06F 17/5009* (2013.01); *G05B 17/02* (2013.01); *G05B 23/0208* (2013.01); *G06F 8/34* (2013.01); *G05B 2219/32155* (2013.01); *G05B 2219/34202* (2013.01)

(58) Field of Classification Search
CPC ..... G06F 17/5009; G06F 8/34; G06N 99/005; C10G 11/187; G05B 17/02; G06Q 10/00
See application file for complete search history.

(56) References Cited

U.S. PATENT DOCUMENTS

| | | |
|---|---|---|
| 6,609,123 B1 | 8/2003 | Cazemier et al. |
| 6,610,106 B1 | 8/2003 | Jenks |
| 7,082,383 B2 | 7/2006 | Baust et al. |
| 7,165,226 B2 | 1/2007 | Thurner et al. |
| 7,216,116 B1 | 5/2007 | Nilsson et al. |
| 7,263,672 B2 | 8/2007 | Cox et al. |
| 7,636,722 B2 | 12/2009 | Bunkerr et al. |
| 7,689,970 B1 | 3/2010 | Englehart et al. |
| 7,716,253 B2 | 5/2010 | Netz et al. |
| 7,747,958 B2 | 6/2010 | Luo et al. |
| 8,010,324 B1 | 8/2011 | Crowe et al. |

(Continued)

OTHER PUBLICATIONS

Ikeda, et al., "Provenance-Based Debugging and Drill-Down in Data-Oriented Workflows", 2012 IEEE 28th International Conference on Data Engineering (ICDE), Apr. 1-5, 2012, pp. 1-4, [DOI 10.1109/ICDE.2012.118].

(Continued)

*Primary Examiner* — Kandasamy Thangavelu
(74) *Attorney, Agent, or Firm* — Cooper Legal Group, LLC

(57) ABSTRACT

Among other things, one or more techniques and/or systems are provided for facilitating development, by a user, of a model describing a condition of an industrial asset. An output parameter of the model can be defined within a model development environment. The output parameter describes a condition of the industrial asset and can be defined using one or more variables. During deployment of the model within a deployment environment, respective variables of the model can be mapped to a data store where data associated with the variable is located. In this way, during development, a user can specify variables to be used within the model without specifying where to fetch and/or push data associated with the variable, for example. Further, the model can be executed within the deployment environment to assess the condition for a plurality of industrial assets.

20 Claims, 12 Drawing Sheets

(56) References Cited

U.S. PATENT DOCUMENTS

| | | |
|---|---|---|
| 8,014,983 B2 | 9/2011 | Crowe et al. |
| 2002/0077711 A1* | 6/2002 | Nixon ............... C10G 11/187 700/51 |
| 2005/0096774 A1 | 5/2005 | Bayoumi et al. |
| 2005/0171746 A1* | 8/2005 | Thalhammer-Reyero ............ G05B 17/02 703/2 |
| 2005/0234969 A1 | 10/2005 | Mamou et al. |
| 2005/0246135 A1 | 11/2005 | Van Harn |
| 2007/0240069 A1 | 10/2007 | Eldridge et al. |
| 2008/0022264 A1* | 1/2008 | Macklem ............... G06F 8/34 717/136 |
| 2012/0191439 A1* | 7/2012 | Meagher ............ G06F 17/5009 703/18 |
| 2012/0290104 A1* | 11/2012 | Holt .................. G06Q 10/00 700/29 |
| 2012/0303150 A1 | 11/2012 | Krishnaswamy et al. |
| 2012/0317058 A1* | 12/2012 | Abhulimen .......... G06N 99/005 706/2 |
| 2012/0324420 A1 | 12/2012 | Collinson |

OTHER PUBLICATIONS

Int. Search Report in PCT Application No. PCT/US2014/041671 dated Sep. 25, 2014, 9 pgs.

* cited by examiner

MODEL DEVELOPMENT ENVIRONMENT FOR ASSISTING USER IN DEVELOPING MODEL DESCRIBING CONDITION OF INDUSTRIAL ASSET

BACKGROUND

The present application relates to industrial assets and more particularly to systems and/or techniques for facilitating development, by a user, of a model describing one or more conditions of an industrial asset. The systems and/or techniques find particular application to industrial assets of a power system, such as electrical components and/or non-electrical components thereof, but may also find applicability in non-power related industries where it may be useful to analyze data pertaining to an industrial asset to determine a condition of industrial asset (e.g., a health condition, a criticality condition describing the importance of the industrial asset to a system, etc.).

A power system comprises a plurality of industrial assets, including electrical equipment and non-electrical equipment used to supply, transmit, and/or use electrical power. Electrical equipment of such a system can include, among other things, turbines, transformers, circuit breakers, capacitors, voltage regulators, batteries, and/or power lines, for example. Non-electrical equipment of such a system can include, among other things, storage cabinets, utility poles, and/or transmission towers, for example. Often, such equipment is designed to last decades, and the degradation or failure of such equipment may result in the loss of power to consumers, may result in cascading damages to other industrial assets, and/or may result in fines being levied against a utility provider. Accordingly, preemptive maintenance may be desirable to mitigate a risk of failure and/or to mitigate associated impacts, such as on operations or business objectives.

Given the large number of industrial assets typically comprised within a power system, models may be developed which evaluate data yielded from sensors, images, field tests, inspection reports, etc. Such models are configured to, among other things, programmatically assess the health of industrial assets and/or develop maintenance schedules for performing maintenance actions on the industrial assets.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to an aspect, a method for facilitating development, by a user, of a model describing a condition of an industrial asset is provided. The method comprises defining a first output parameter of the model, the first output parameter describing a condition of the industrial asset. The defining comprises associating, in response to input from the user, a first variable with the first output parameter, the first variable associated with a first set of data. The associating is performed without the user identifying a first location where the first set of data is stored. The defining also comprises defining a first argument type that specifies how to compute the first output parameter based upon the first variable.

According to another aspect, a system for facilitating development, by a user, of a model describing a condition of an industrial asset is provided. The system comprises a hosting component configured to host a model development environment for developing the model. The hosting component comprises an output parameter module configured to facilitate defining a first output parameter of the model. The defining comprises associating, in response to input from the user, a first variable with the first output parameter, the first variable associated with a first set of data. The associating is performed without the user identifying a first location where the first set of data is stored. The defining also comprises defining a first argument type that specifies how to compute the first output parameter based upon the first variable.

According to yet another aspect, a system for deploying a model describing a condition of an industrial asset is provided. The system comprises a variable association module configured to link a variable of the model with a first data store comprising data associated with the variable. The system also comprises an output parameter association module configured to link an output parameter, describing the condition of the industrial asset, with a second data store for storing data associated with the output parameter.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
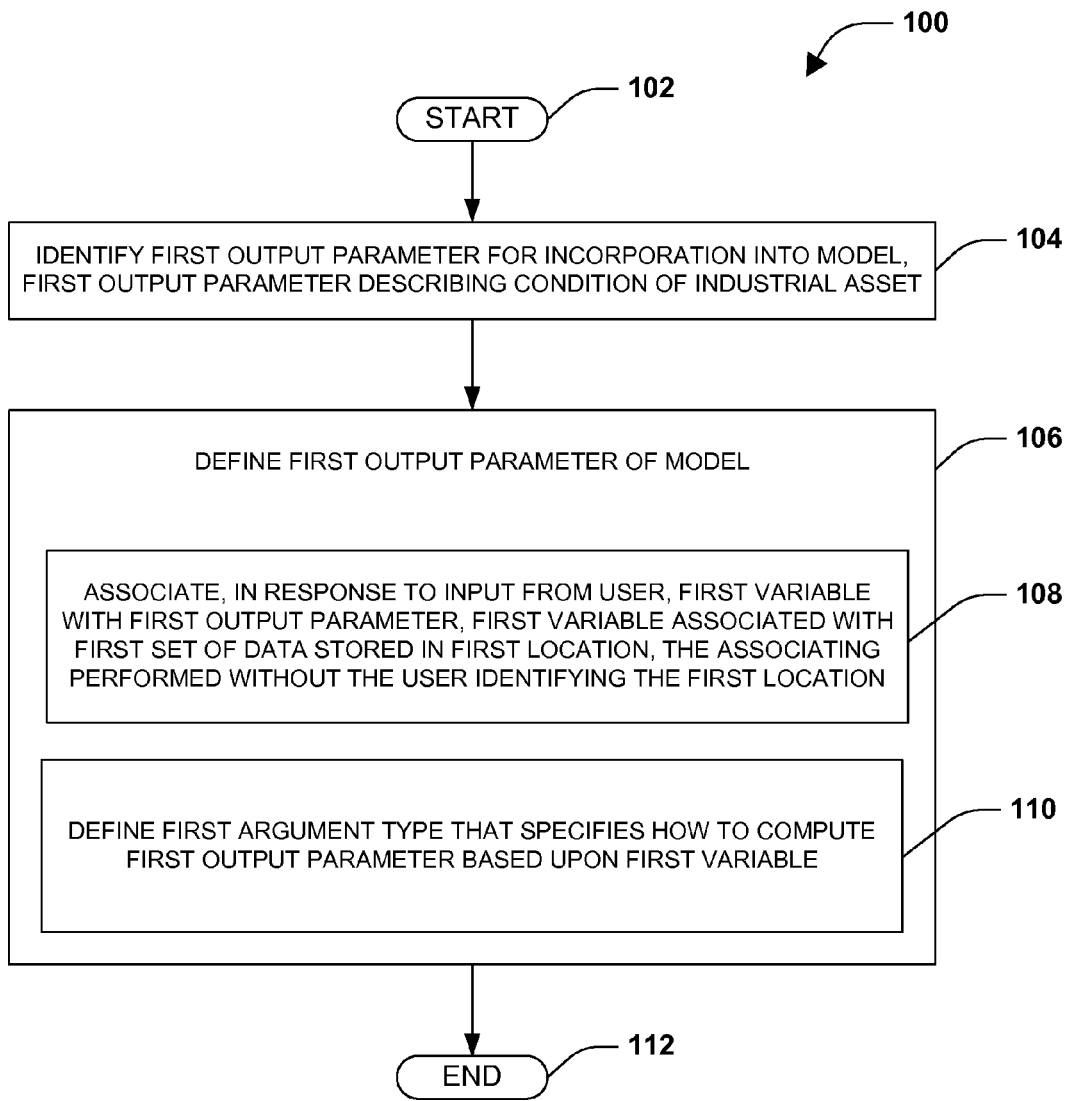
FIG. 1 is a flow diagram illustrating an example method for facilitating development, by a user, of a model describing a condition of an industrial asset.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. In other instances, structures and devices are illustrated in block diagram form in order to facilitate describing the claimed subject matter.

As used herein, a development environment describes an environment in which one or more models are developed and a deployment environment describes an environment in which at least some of the one or more models are deployed and/or executed. In some embodiments, the development environment and the deployment environment may be the same environment. In other embodiments, the development environment may be different than one or more deployment environments. By way of example, a model may be developed in a development environment where a user may specify variables (e.g., inputs) to the model and/or output parameters (e.g., outputs) of the model, which may be packaged into a software package comprising an application programming interface (API). The software package may then be deployed in one or more deployment environments where respective variables of the model can be mapped to one or more input data stores comprising data (e.g., in a desired format or reformatted to the desired format) associated with the variable and/or where respective output parameters of the model can be mapped to one or more output data stores where data generated from the model (e.g., and associated with the output parameter) can be stored. In some embodiments, the models may also be executed within the one or more deployment environments (e.g., within a utility provider's enterprise application ecosystem) to repeatedly assess one or more industrial assets according to the model.

The term model is used herein to refer to an analytical model configured to describe a calculation process and/or analysis process which transforms data input(s) into output(s) (e.g., data output(s). Moreover, the phrase industrial asset is used herein to describe a piece of equipment and/or a group of equipment physically or logically assembled together to form a production unit. Examples of such industrial assets may include a transformer, circuit breaker, sub-station (e.g., comprising one or more transformers and/or one or more circuit breakers), transmission towers, power generation turbine, etc.

A power system comprises thousands if not millions of industrial assets, which may include both electrical equipment and non-electrical equipment. Utility providers and other entities routinely monitor and/or inspect such electrical equipment and/or non-electrical equipment to assess the health of the equipment, assess efficiency of the equipment, detect early signs of failure, etc. For example, sensors may be coupled to equipment and may be configured to measure various properties of the equipment (e.g., internal temperature, ambient air temperature, dissolved gas concentration, load, stresses on the equipment, structural fatigue of the equipment, etc.). Further, field test and/or inspections may be intermittently performed to gather more information about the performance of such equipment. By way of example, oil samples may be collected from a transformer during a field test to measure concentrations of dissolved gases that are not measurable via sensors.

Given the size of such power systems and/or the scope of data available, it is often difficult for users to manually evaluate the health of various industrial assets, to manually develop a maintenance schedule (e.g., specifying repair actions and/or replacement actions) for various industrial assets, and/or to prioritize maintenance across the power system. Accordingly, models are developed which receive data and evaluate/predict a condition (e.g., health, criticality, etc.) of an industrial asset during a specified time period (e.g., a specified time period, which may include past, present, or future times), prioritize maintenance actions, and/or recommend other actions to take (e.g., such as actions which modify operations of the industrial asset and/or which request additional data readings to improve predictions and/or confidences of predictions), for example. The received data may include operational data (e.g., yielded from sensors coupled to industrial assets, field-test data, inspection reports, etc.) heat-run test data (e.g., indicative of the performance of an industrial asset at the time of manufacturing), operational forecasts (e.g., indicative of expected operational changes to the power system and/or equipment thereof over a specified forecast window), environmental forecast (e.g., indicative of weather conditions during a specified forecast window), etc.

Conventionally, the models have been conceptually developed by subject matter experts with knowledge regarding the industrial assets. For example, the subject matter experts may have knowledge regarding factors that may impact performance of an industrial asset, factors that may foreshadow an event to an industrial asset (e.g., such as a contamination event, outage event, fire event, etc.), and/or factors that may foreshadow the failure of an industrial asset, for example. After the model has been conceptually developed, the subject matter expert turns to a programmer to reduce the model to practice in a specific environment or for a specific application. The programmer typically has a different knowledge set than the subject matter expert. For example, the programmer may have knowledge regarding where the data used in the model is located, how to fetch such data, and/or how to format such data for analysis by the model. Accordingly, the process for developing a model is slow and multi-disciplinary (e.g., requiring the skill and time of multiple parties with different knowledge sets).

Systems and/or techniques for developing a model, within a development environment, via a model development environment are provided for herein. The model development environment is configured to allow a user, such as a subject matter expert, to conceptually develop the model and to reduce the model to practice. More particularly, the model development environment facilitates development of a structure for analyzing data to achieve a desired set of one or more output parameters. Respective output parameters can be associated with a variable(s), where a value of the output parameter is a function of a value(s) of the variable(s). By way of example, the expected life of an overhead power cable (e.g., a first output parameter) may be a function of the number of times lightning has struck the overhead power cable (e.g., where the variable is the number of lightning strikes). In some embodiments, when the user is finished developing the model and/or when the user wants to deploy the model in the deployment environment, the model development environment packages the model into a software package (e.g., at the behest of the user), which may include generating a Model Application Programming Interface (API) and/or two well defined extensibility mechanisms for connecting the variables to data stores comprising data associated with the variable (e.g., comprising data used by the model to calculate an output) and/or for connecting the output parameters to data stores for storing data output by the model.

In some embodiments, when the model is deployed within a deployment environment, a second user, such as a database expert, and/or an automated database machine learning system identifies (e.g., from the Model API) the types of data and/or the format of data the model intends to use and maps respective variables to a data store where data associated with the variable (e.g., data used by the variable) is stored. For example, a first variable of the model (e.g., number of lightning strikes) may be mapped to a first data store which stores data corresponding to the number of lightning strikes experienced by respective cables of a power system and/or a second variable of the model (e.g., number of surges) may be mapped to a second data store which stores data corresponding to the number of surges experienced by respective cables of a power system. Further, the second user may determine where, within the deployment environment, an entity wishes to store data output from the model and may map respective output parameters to a data store where it is desirable to store data associated with the output parameter.

In other embodiments, one or more such mappings between variables and data stores may be defined in advance by the second user, and these lists of variables may be provided as reference lists, and the first user, developing the model, may select variables from the reference list for incorporation into the model being developed in the development environment.

In some embodiments, the implementation of logic used to connect the Model API to the data sources can be generated per model or applied to more than one specification of the Model API. Moreover, in some embodiments, logic can cache frequently used data and/or perform repeated calculations used by more than one model in order to improve the performance and scalability requirements of execution of one or more models. In this way, programmers or learning systems that are better suited to handling logic than model develops can specify how to connect input variables and/or output parameters to data stores. Further, the use of logic to cache frequently used data and/or perform repeated calculation may facilitate executing one or more models more rapidly and/or in larger numbers, which may allow end users reviewing the results of the execution of the model to benefit by making more efficient decisions based on the results of the model, for example.

In some embodiments, when the model is deployed within a deployment environment one or more variables may be associated with data that does not exist in a data store of the deployment environment (e.g., such as data indicative of trends, forecast, rate of change, etc.). For example, the data may be derived based upon performing a calculation using data available in a data store(s). Accordingly, the second user can develop preprocessing services that fetch the data used in the calculation from the data store(s) and perform a calculation using the data (e.g., avoiding costly fetches by using caching services etc. before providing the data to the API). In some embodiments, the second user can also develop post processing services to store data output from the model, annotate results of the model, and/or fetch results of the model, for example.

The data that is associated with variables can include operational data (e.g., performance monitoring), observational data (e.g., condition monitoring), and/or statistical data (e.g., fleet monitoring), for example. In some embodiments, the data can also include nameplate data (e.g., identifying an industrial asset and/or describing one or more characteristics of the industrial asset such as maximum load), environmental data (e.g., such as weather forecasts, ambient air temperature, etc.), and/or other types of external data not acquired directly from an industrial asset, for example.

Within the model development environment, a user can interactively create, validate, and/or evolve one or more models for describing a condition(s) of an industrial asset(s). Such models can include flowcharts, decision trees, Bayesian belief networks, travel curves, statistical analysis, machine learning models, visual manipulation models, scripts, and/or other design paradigms. Further, in some embodiments, a graphical user interface of the model development environment is configured to present various sets of tools based upon the design paradigm selected for the model and/or type of model to be developed (e.g., a first set of tools may be presented for a type of model (e.g., asset health) and a second set of tools may be presented for a second type of model (e.g., asset criticality). In some embodiment, the deployment of the model follows the same deployment logic of generating API regardless of the design paradigm selected and/or type of model to be developed. In other embodiments, different deployment logic may be utilized for different design paradigms and/or different types of models.

In some embodiments, the user defines a set of desired variables for the model without concern regarding how the data associated with respective variables is fetched and/or where the data is fetched from (e.g., the user does not have to have access to a global data dictionary describing where the data is located and/or does not have to have knowledge regarding whether such data is defined in the global data dictionary). In some embodiments, the model development environment further facilitates annotation of the model, such as by the user, to describe the function(s), reference sources, or other characteristics of one or more aspects of the model, for example. In some embodiments, the model development environment may be further configured to package the model (e.g., in a web service format, dynamic-link library (DLL) format, etc.) for deployment within a desired deployment environment (e.g., such as within a utility provider's enterprise application ecosystem).

Referring to FIG. 1, an example method 100 for facilitating development, by a user, of a model describing a condition of an industrial asset is provided. That is, stated different, the method 100 facilitates the development (e.g., within a development environment) of a model which utilizes a user defined set of variables to determine values of one or more output parameters when a set of data for an industrial asset, and associated with the defined set of variables, is input. The values of the one or more output parameters are indicative of the condition of the industrial asset. The method 100 starts at 102, and a first output parameter is identified for incorporation into the model at 104.

The first output parameter describes the condition of the industrial asset. More particularly, the first output parameter describes the output of a function (e.g., where the function is further defined at 108 and 110 in the example method 110) related to the condition of the industrial asset. A value of the output parameter, calculated for a given industrial asset based upon a defined set of input data corresponding to the given industrial asset, may be factored into determining the overall condition of the industrial asset, factored into a prediction regarding one or more events which may impact the industrial asset, and/or factored into an action plan for the industrial asset (e.g., describing maintenance actions, operational actions, and/or diagnostic actions that are suggested to be performed on an industrial asset), for example.

Examples of the first output parameter may include, among other things, a health rating parameter (e.g., where the health of the industrial asset is assigned a numerical score), actual age parameter, effective age parameter (e.g., based upon operational performance, environment impacts, etc.), remaining useful life parameter, health description parameter, and/or action plan parameter (e.g., where a value of the action plan parameter may be a maintenance action or operational action for reducing the likelihood that an event will occur and/or a diagnostic action for improving a confidence in a prediction).

In some embodiments, the first output parameter is identified by default based upon a type of model the user is intending to develop. By way of example, in some embodiments, a type of model to be developed may be defined based upon input from a user, where respective types of models may be associated with a different set of output parameters. A first set of one or more output parameters are defined if the user selects to construct a first type of model, (e.g., output parameters that are usually of interest to users developing that type of more model are defined) and a second set of one or more output parameters are defined if the user selects to construct a second type of model. As an example, the user may choose between, among other things, an asset performance model (e.g., describing the performance of the asset at a given time or during a defined time period) and/or a criticality model (e.g., describing the importance of the industrial asset to the overall system). The asset performance model may be associated with a first set of one or more output parameters (e.g., actual age parameter, effective age parameter, remaining useful life parameter, etc.) and the criticality model may be associated with a second set of one or more output parameters (e.g., importance profile parameter, confidence profile parameter, etc.). Accordingly, the first set of one or more output parameters may be identified for incorporation into the model when the user selects to develop an asset performance model and the second set of one or more output parameters may be identified for incorporation into the model when the user selects to develop a criticality model. In other embodiments, the user may select, from a set of output parameters, one or more output parameters to be incorporated into the model (e.g., and thus the identification of an output parameter is made at least in part based upon input from the user). In still other embodiments, one or more output parameters may be identified based upon input from the user (e.g., such as where no output parameters are identified based upon the type of model being developed and/or where the user wishes to add new output parameters to a set of output parameters identified by default).

In some embodiments, where the output parameter(s) is identified based upon the type of model to be developed, one or more output parameters for the model may be modified in response to user input. By way of example, the model may be defined as a performance model type and a predefined set of output parameters for the performance model type, including an effective age parameter and an actual age parameter, may be selected for incorporation into the model. Input from the user may then be received indicative of a user's desire to replace the actual age parameter with a health rating parameter, and such a replacement may be initiated in response to the input. In this way, a user may modify a set of pre-selected output parameters as desired, for example.

At 106 in the example method 100, the first output parameter is defined. That is, data that is to be considered when generating a value (e.g., numerical value, word/phrase, etc.) of the first output parameter for a given industrial asset and/or a technique for evaluating such data is defined at 106.

Defining the first output parameter comprises associating, in response to input from the user, a first variable with the first output parameter at 108 in the example method 100. The first variable describes a factor that influences a value of the first output parameter. During development, a location where data associated with the first variable is stored may be unknown (e.g., because a first deployment environment in which the model is to be deployed may store such data in a first data store and a second deployment environment in which the model is to be deployed may store such data in a second data store). According, the first variable merely describes a type of data (e.g., ambient air temperature data, dissolved gas concentration data, etc.) to be used. Where the location of such data is unknown at the time of development, for example, the first variable may be mapped to a data store comprising data associated with the first variable at a later time, such as when the model is deployed within a deployment environment. In other embodiments, a location where data associated with the first variable is stored may be known during development and the first variable may be mapped to a data store comprising such data prior to associating the first variable with the first output parameter, for example.

Defining the first output parameter also comprises defining a first argument type for the first output parameter at 110 in the example method 100. The first argument type specifies how to compute a value for the first output parameter based upon the first variable. That is, stated differently, the first argument type specifies how the data is to be processed to compute a value for the first output parameter. In some embodiments, the first argument type is defined based upon input from the user. For example, the user may be presented with a set of argument types, such as among other things, a Boolean argument type, a string argument type, an object argument type, an integer argument type, a floating point argument type, and/or a string argument type, and based upon input from the user an argument type may be defined from the set of argument types. It may be appreciated that such an argument type may be a simple argument type (e.g., primitive, integer, string, etc.) and/or may be a compound argument type (e.g., object, array, list, collection, etc.).

In some embodiments, the first argument type is predefined based upon the first output parameter. By way of example, an effective age parameter may be associated with a floating point argument type by default. Accordingly, when the effective age parameter is selected to be incorporated into a model, an argument type for the effective age output parameter may be defined as a floating point argument type by default.

In some embodiments, the first argument type is predefined based upon the type of model to be developed. By way of example, as previously described, a set of one or more output parameters may be associated with a model type by default, and may be incorporated into the model by default upon a selection of the model type. In some embodiments, one or more output parameters of the set may be further associated with a respective argument type. For example, a first output parameter (e.g., effective age parameter) of the set may be associated with a first argument type (e.g., floating point) and a second output parameter (e.g., health class parameter) of the set may be associated with a second argument type (e.g., string) by default. In some embodiments, the first output parameter may be associated with different argument types by default based upon the type of model to be developed. For example, the first output parameter may be associated, by default, with a first argument type (e.g., floating point) for an asset performance model and may be associated, by default, with a second argument type (e.g., Boolean) for a criticality model.

In some embodiments, the default argument type (e.g., as defined based upon the output parameter and/or the type of model to be developed) can be modified based upon input from the user. By way of example, the effective age parameter may be modified to be defined as a string argument type based upon input from the user indicative of a desire to change the argument type of the effective age parameter from a floating point argument type to a string argument type for the particular model the user is developing.

In still some embodiments, no argument type is predefined for the first output parameter. Accordingly, in such embodiments, defining the first argument type may comprise defining the first argument type based upon input received from the user, for example.

The method 100 ends at 112 after an output parameter has been selected and defined (e.g., in terms of input data utilized to calculate a value of the output parameter).

It may be appreciated that while the example method describes identifying and defining merely one output parameter, the model development environment may facilitate identifying and/or defining a plurality of output parameters according to methods similar to the method 100 of FIG. 1. By way of example, a method similar to the foregoing method 100 may be used to identify a second output parameter describing the condition of the industrial asset and/or may be used to define the second output parameter. Further, when the model is deployed within a deployment environment (e.g., a utility provider's enterprise application ecosystem), respective output parameters may be mapped to a data store where output data associated with the output parameter may be stored, for example.

FIGS. 2-7 illustrate example graphical user interfaces 200a-f of a model development environment at various states in the development of a model describing a condition of an industrial asset. Common features among the example graphical user interfaces 200a-f include a toolbox portion 202 comprising representations of one or more nodes that can be added to the model and a model development portion 204 for displaying a representation of the model (e.g., including the nodes). The representations of one or more nodes and/or the representation of the model can include textual representations, symbols, and/or other graphical representations.

In the illustrated embodiment, nodes that can be added to the model are sub-divided into three groups in the toolbox portion 202 based upon a type of function associated with the node. For example, representations of nodes that describe a structure and/or organization of the model are arranged in a group entitled "Flowchart" 206. By way of example, "Decision" 208 may represent a logical decision node that can be added to a flow chart (e.g., where a first output is generated if data input into the decision node satisfies a specified criteria and a second output is generated if the data input into the decision node does not satisfy the specified criteria). As another example, "Switch" 210 may represent a logical switch node in the flow diagram (e.g., where data input into the switch node is routed to a first recipient if the data input into the switch node satisfies a specified criteria and is routed to a second recipient if the data input into the switch element does not satisfy the specified criteria).

As another example, representations of nodes that define how to process input data to generate a desired output parameter are arranged in a group entitled "Primitives" 212. By way of example, "A+B Assign" 214 may represent a node that can be added to the model and presented to a user to facilitate selecting an output parameter for incorporation into the model and/or to facilitate defining the output parameter.

As another example, representations of nodes that define a collection of output parameters and/or a collection of variables are arranged into a group entitled "Collection" 216. Respective collections comprise a set of objects and/or a set of primitives. By way of example, "For each" 218 may represent a node that can be added to the model and comprises a first set of objects which are initialized within the model development environment. After the first set of objects are initialized, user input can be received which adds one or more variables to the collection using a user-interface tailored to attributes of the object, for example.

In some embodiments, representations of nodes may be provided and/or organized in the toolbox portion 202 into various node groups representing types or styles of asset analysis (e.g., performance monitoring methods, condition monitoring methods, fleet monitoring methods, machine learning methods, etc.). These methods may be applicable to analyzing individual industrial assets, fleets of similar industrial assets within an enterprise, fleets of similar industrial assets across multiple enterprises, or aggregations of heterogeneous groups of industrial assets. For example, in a node group for determining similarity of industrial assets to one or more families, representations of nodes may be provided and/or organized for ease of consideration of nameplate data, operational data, sensor data, environmental data, and/or other types of external data to identify subsets of fleet assets which may be similar to the industrial asset under study. As one example, a first node group may include representations of nodes configured to perform statistical calculations (e.g. mean, minimum, maximum, variance, count), and a second node group may include representations of nodes configured to perform linear regression calculation primitives (e.g. least squares curve fitting for various types of curves, such as linear, exponential, or spline, for example). As another example, a node group for fleet monitoring analyses may include representations of nodes for calculating mean time between failure for similar industrial assets. As another example, a node group for analyzing individual industrial assets may include representations of nodes for comparing the industrial asset under study with fleet characteristics, which may be obtained as input variables or calculated using the similarity analysis nodes and/or fleet monitoring analysis nodes, for example.

In still some embodiments, representations of nodes may be provided and/or organized in the toolbox portion 202 into various groups representing general or domain-specific approaches for analysis of interdependencies among heterogeneous sets of related industrial assets. For example, a first node group may include representations of nodes configured to perform power flow analysis functions based upon an input variable containing connectivity information such as a single-line diagram.

It may be appreciated that the nodes represented in the toolbox portion 202 may be a function of the design paradigm selected for the model. By way of example, a first set of representations, representing a first set of nodes, may be included within the graphical user interface 200a-f when the design paradigm that is selected is a flow chart and a second set of representations, representing a second set of nodes, may be included within the graphical user interface 200a-f when the design paradigm that is selected is a Bayesian network.

Figure 2:
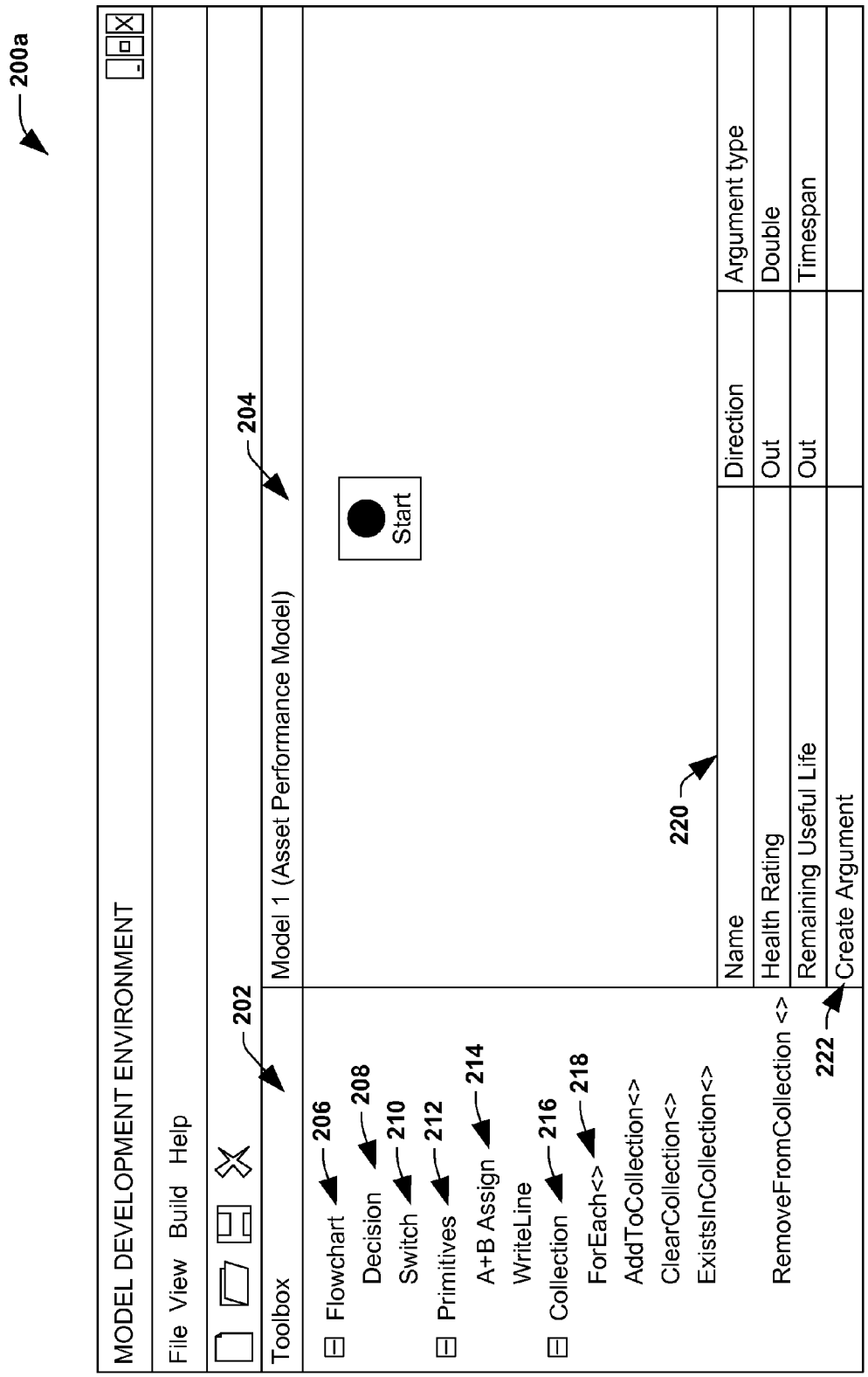
FIG. 2 illustrates an example graphical user interface of a model development environment.

Referring to FIG. 2, a graphical user interface 200a of the model development environment at a first state prior to assembly of the model is illustrated. The design paradigm selected for this model is a flow diagram and the type of model being constructed is an asset performance model.

The graphical user interface 200a comprises an output parameter portion 220 including one or more fields for presenting output parameters that are identified for incorporation into the model. Initially, in some embodiments, the output parameter portion 220 may include output parameters that have been identified by default based upon the type of model being constructed. By way of example, a health rating parameter and a remaining useful life parameter may have been identified by default based upon input from a user specifying that an asset performance model is to be constructed. Moreover, an argument type may be defined for respective output parameters by default. For example, an argument type for the health rating parameter may be defined by default as a floating point argument type and an argument type for the remaining useful life parameter may be defined by default as a timespan argument type.

In some embodiments, the output parameter portion 220 further comprises an argument creation field 222 for defining a new output parameter. For example, the argument creation field may be selected by the user to facilitate creating of a new output parameter for the model and/or defining an argument type for the new output parameter.

Figure 3:
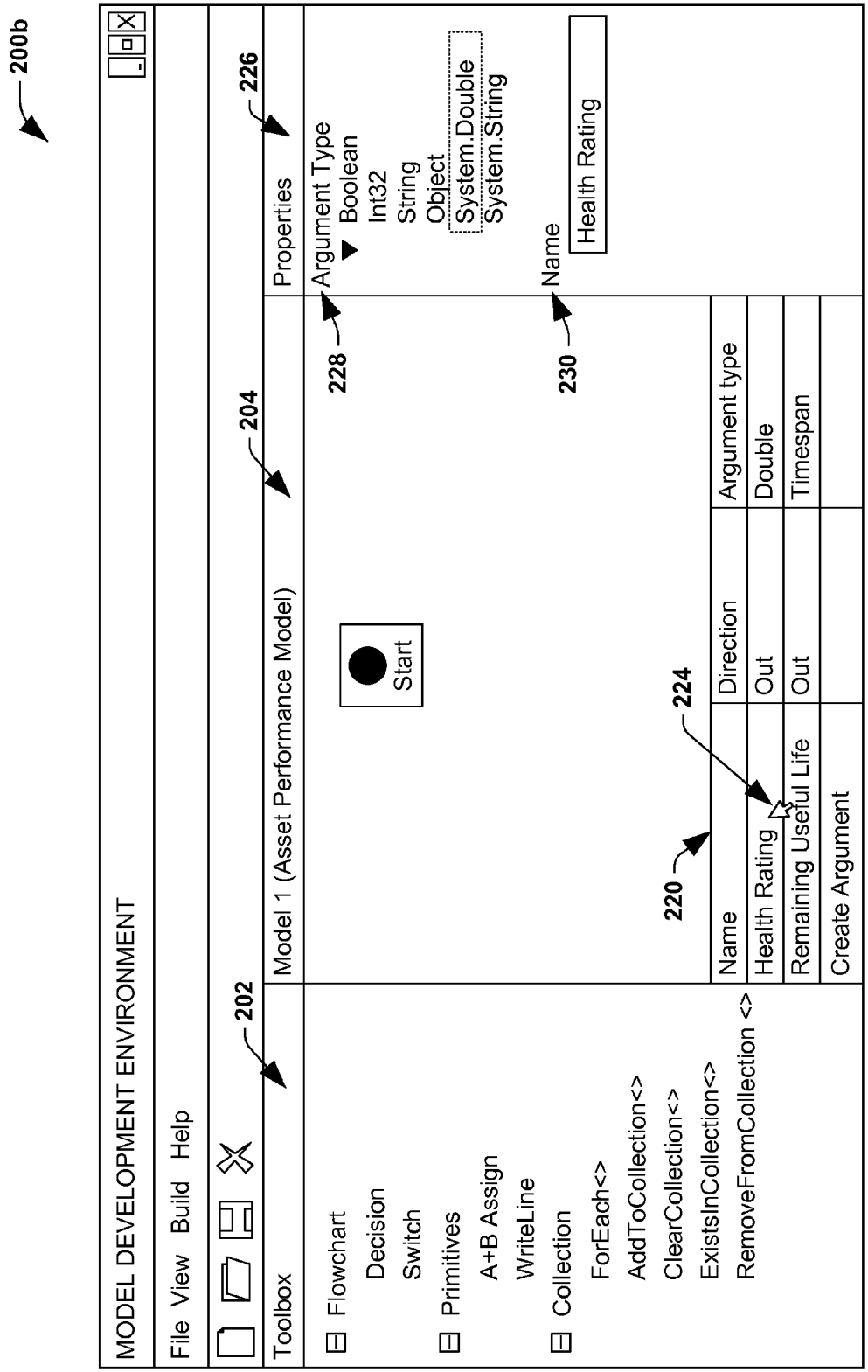
FIG. 3 illustrates an example graphical user interface of a model development environment.

Referring to FIG. 3, a graphical user interface 200b of the model development environment at a second state prior to assembly of the model is illustrated. The graphical user interface 200b has been modified (e.g., relative to the graphical user interface 200a of FIG. 2) to include a properties portion 226 configured to display one or more properties of a parameter, node, variable, etc. that has been focused upon. By way of example, a user may have navigated a cursor 224 over the health rating parameter, which is displayed in the output parameter portion 220. Responsive to such an action, the model development environment may be configured to display the properties portion 226. In other embodiments, other user initiated actions or non-user initiated actions may trigger the properties portion 226 to appear within the graphical user interface 200b.

Because the cursor 224 is hovering over the health rating parameter, the model development environment may be programmed to infer that the health rating parameter is being focused upon and the properties portion 226 may display one or more properties of the health rating parameter. For example, a drop-down menu 228 of available argument types for the health rating parameter may be displayed within the properties portion 226. In this way, a user may modify the default argument type for the health rating parameter and/or may define an argument type for the health rating parameter if no argument type has been defined by default. As another example, a name field 230 may be displayed within the properties portion 226. The name field 230 may be configured to receive input characters, where the health rating parameter can be renamed based upon the received input character.

It may be appreciated that the features displayed with the properties portion 226 of the graphical user interface 200b may be a function of what aspect of the graphical user interface 200b is being focused upon. For example, as will be further described with respect to FIG. 5, the properties portion 226 may display different fields, drop-down menus, etc. when the focus is on a node within the model development portion 204 as compared to when the focus is on an output parameter displayed within the output parameter portion 220.

Figure 4:
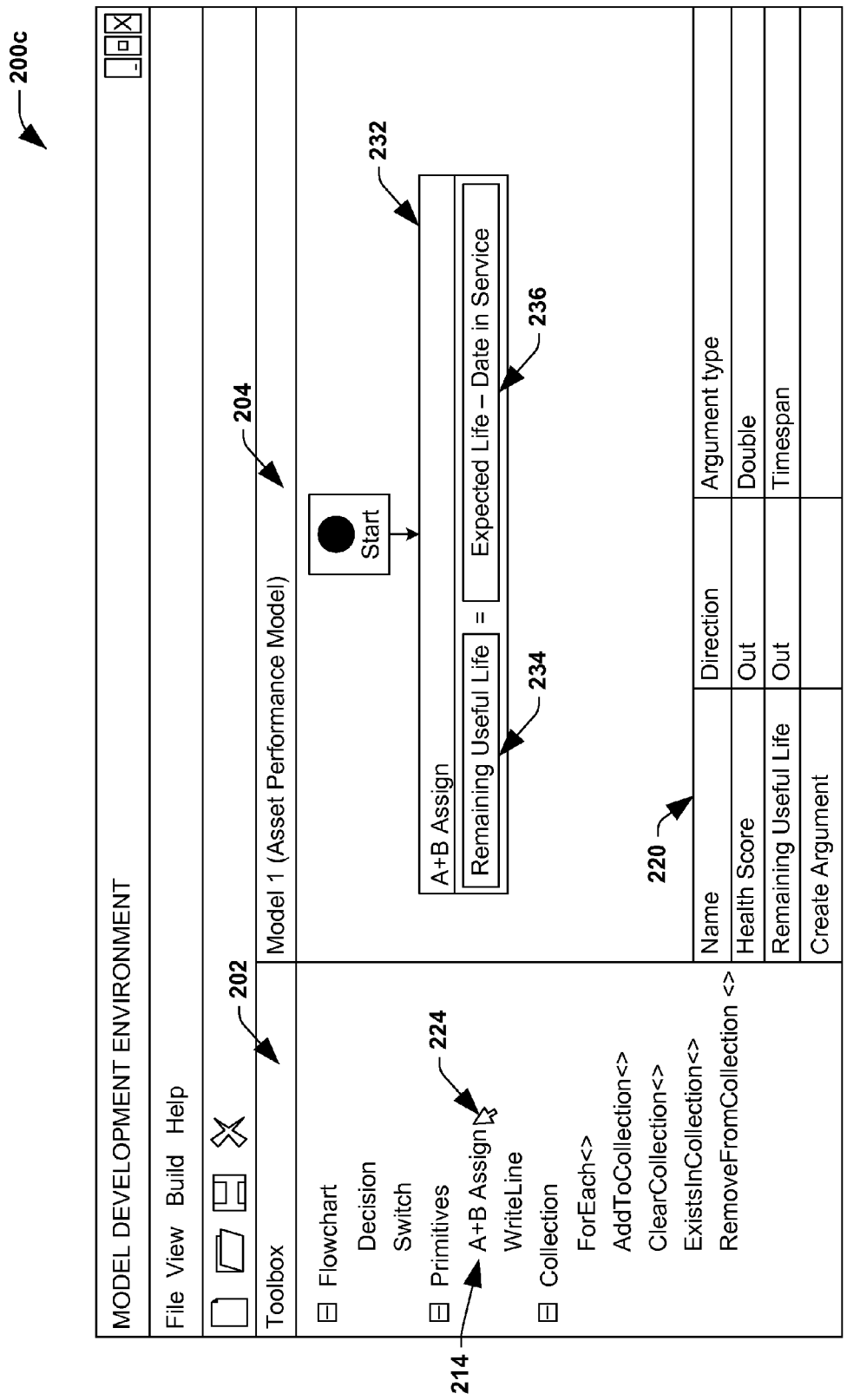
FIG. 4 illustrates an example graphical user interface of a model development environment.

Referring to FIG. 4, when a user desires to begin assembling a model that outputs values for the output parameters specified in the output parameter portion 220, the user may interact with one or more representations in the toolbox portion 202. For example, the user may interact with an "A+B Assign" 214 to add a first node 232. Such interaction may include hovering the cursor 224 over the "A+B Assign" 214, dragging-and-dropping the representation from the toolbox portion 202 to the model development portion 204, etc.

As described with respect to FIG. 2, a node represented by the "A+B Assign" 214 is configured to facilitate defining the output parameter (e.g., by allowing a user to associate one or more variables with the output parameter and/or allowing the user to define a first argument type that specifies how to compute the output parameter using the one or more variables). Such a node may comprise a first field 234 describing the output parameter to be defined by the first node 232 and a second field 236 for inserting variables to be used when calculating a value of the output parameter and/or for inserting a function for calculating the value of the output parameter.

By way of example, in the illustrated embodiment, it can be determined from the first field 234 that the output parameter to be defined by the first node 232 is a remaining useful life parameter. Moreover, from the second field 236, it can be determined that the remaining useful life parameter is calculated based upon the difference between an expected life variable and a date in service variable (e.g., where the expected life variable eventually mapped to a first data store comprising data indicative of an expected life of various industrial assets and a date in service variable is eventually mapped to a second data store comprising data indicative of when various industrial assets were placed in service). Accordingly, during an execution of the model, for respective industrial assets where a remaining useful life calculation is desired, data indicative of an expected life of the industrial asset (e.g., based upon manufacturing specifications, average life of other similar industrial assets, etc.) and data indicative of the date the industrial asset was placed into service is retrieved and compared to calculate the remaining useful life of the industrial asset. In some embodiments, such data may also be used to directly calculate a percentage of useful life remaining for the industrial asset and/or may be used as inputs to a fleet analysis node that compares the expired life of the industrial asset to a similar fleet of industrial assets, for example.

Figure 5:
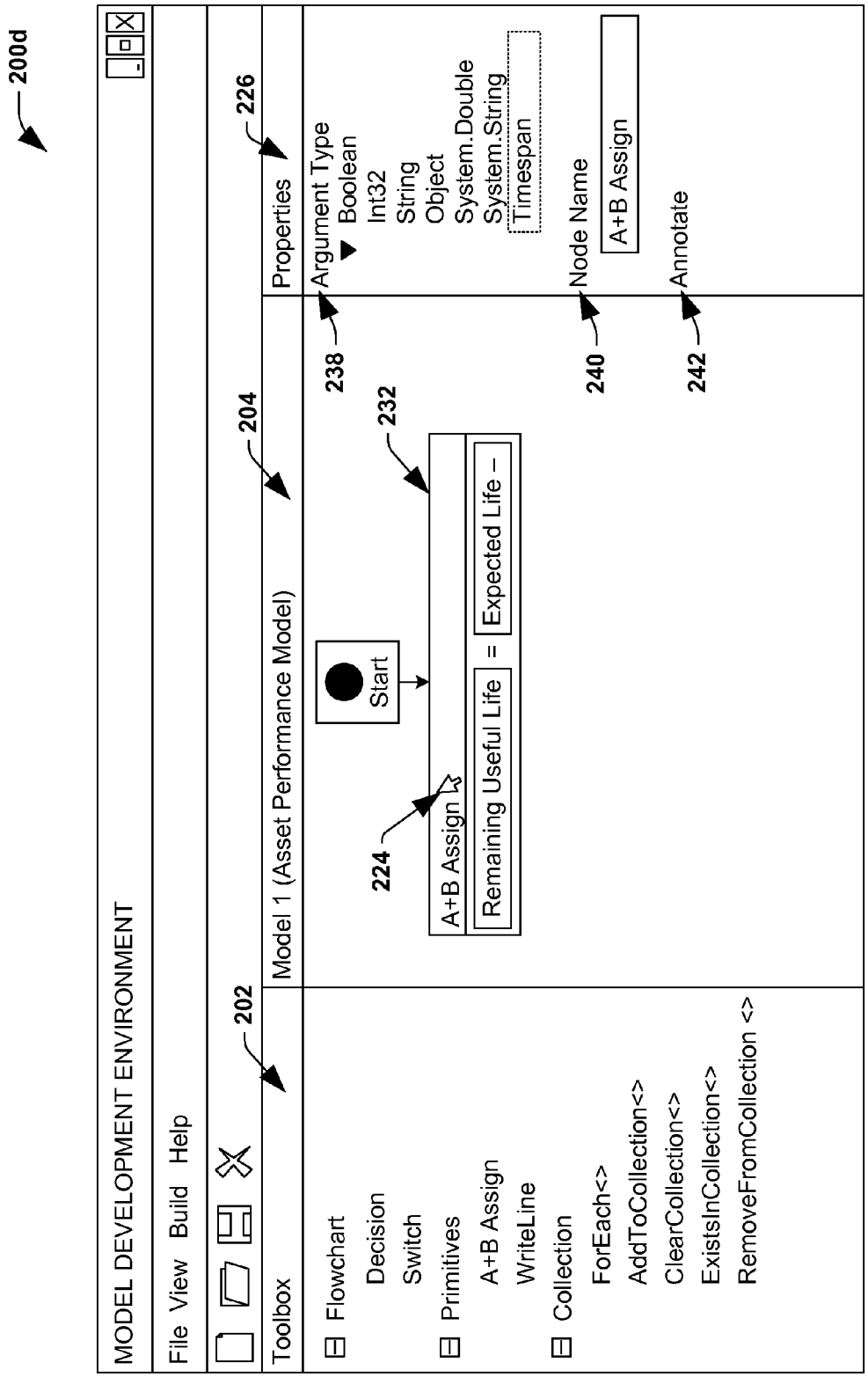
FIG. 5 illustrates an example graphical user interface of a model development environment.

Referring to FIG. 5, a graphical user interface 200d of the model development environment at a fourth state during the development of the model is illustrated. The graphical user interface 200d has been modified (e.g., relative to the graphical user interface 200c of FIG. 4) to include the properties portion 226 describing properties of the first node 232. By way of example, the user may have navigated the cursor 224 over the first node 232, and responsive to such an action, the model development environment may be configured to display the properties portion 226.

The content displayed in the properties portion 226 may be a function of the focused on aspect of the graphical user interface 200d. For example, when the first node 232 is focused on (e.g., as evidenced by the cursor 224 hovering over the first node 232), a drop-down menu 238 displaying possible argument types for computing the remaining useful life parameter may be presented. As another example, a name field 240 for naming the first node 232 and/or for modifying a name of the first node 232 may be presented. As still another example, an annotation aspect 242 may be presented. In some embodiments, such an annotation aspect 242 is configured to facilitate annotating the first node 232 (e.g., offering the user a forum to provide context regarding the first node 232). By way of example, a user may select the annotation aspect 242 to insert a message describing the purpose of the first node 232 in the model and/or to insert other comments (e.g., such as questions for other parties that are assisting in developing the model).

Figure 6:
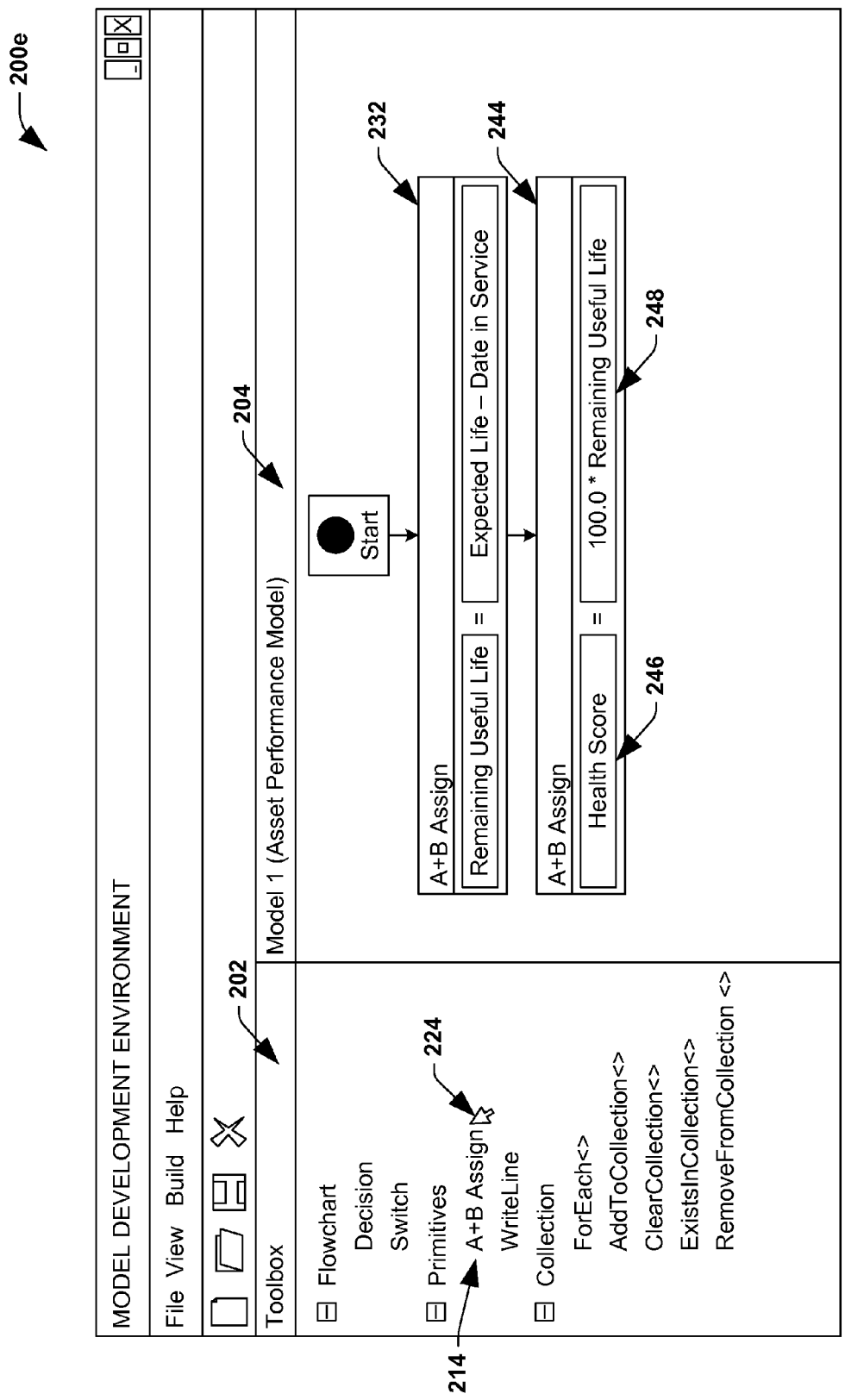
FIG. 6 illustrates an example graphical user interface of a model development environment.

Referring to FIG. 6, a graphical user interface 200e of the model development environment at a fifth state during the development of the model is illustrated. More particularly, a second node 244 has been added to the model development portion 204. For example, the second node 244 may be added to the model development portion 204 when the users interacts with the "A+B Assign" 214 (e.g., by hovering a cursor 224 over the "A+B Assign" 214, dragging-and-dropping the representation from the toolbox portion 202 to the model development portion 204, etc.).

The second node 244 is configured to facilitate defining a second output parameter, as specified in the output parameter portion 220 of the graphical user interface, and comprises a first field 246 and a second field 248. The first field 246 describes the output parameter to be defined by the second node 244 (e.g., health score) and the second field 248 describes variables to be used when calculating a value of the output parameter and/or describes a function for calculating the value of the output parameter, which may be specified based upon user input. For example, the user may specify in the second field 248 that the health score is computed by multiplying a value of the first output parameter (e.g., remaining useful life) by 100.0.

When a variable associated with a second output parameter is a function of first output parameter, such as described with respect to FIG. 6 where the health score is a function of the remaining useful life, the first output parameter and the second output parameter may be said to be linked (e.g., because a value of the second output parameter is dependent upon a value of the first output parameter).

In some embodiments, two nodes and/or two output parameters may be linked in response to input from a user. By way of example, when a user is dragging-and-dropping a representation of the second node 244 from the toolbox portion 202, the user may momentarily obscure a portion of the first node 232 with a portion of the second node 244 (e.g., causing the second node to momentarily overlay the first node). In some embodiments, the model development environment is configured to infer that such an action indicates a desire of the user to link the second output parameter (e.g., health score) with the first output parameter (e.g., remaining useful life) such that a second variable (e.g., associated with the second output parameter) is a function of a value of the first output parameter. In other embodiments, other user initiated and/or non-user initiated actions may infer a desire to link the first output parameter with the second output parameter.

Figure 7:
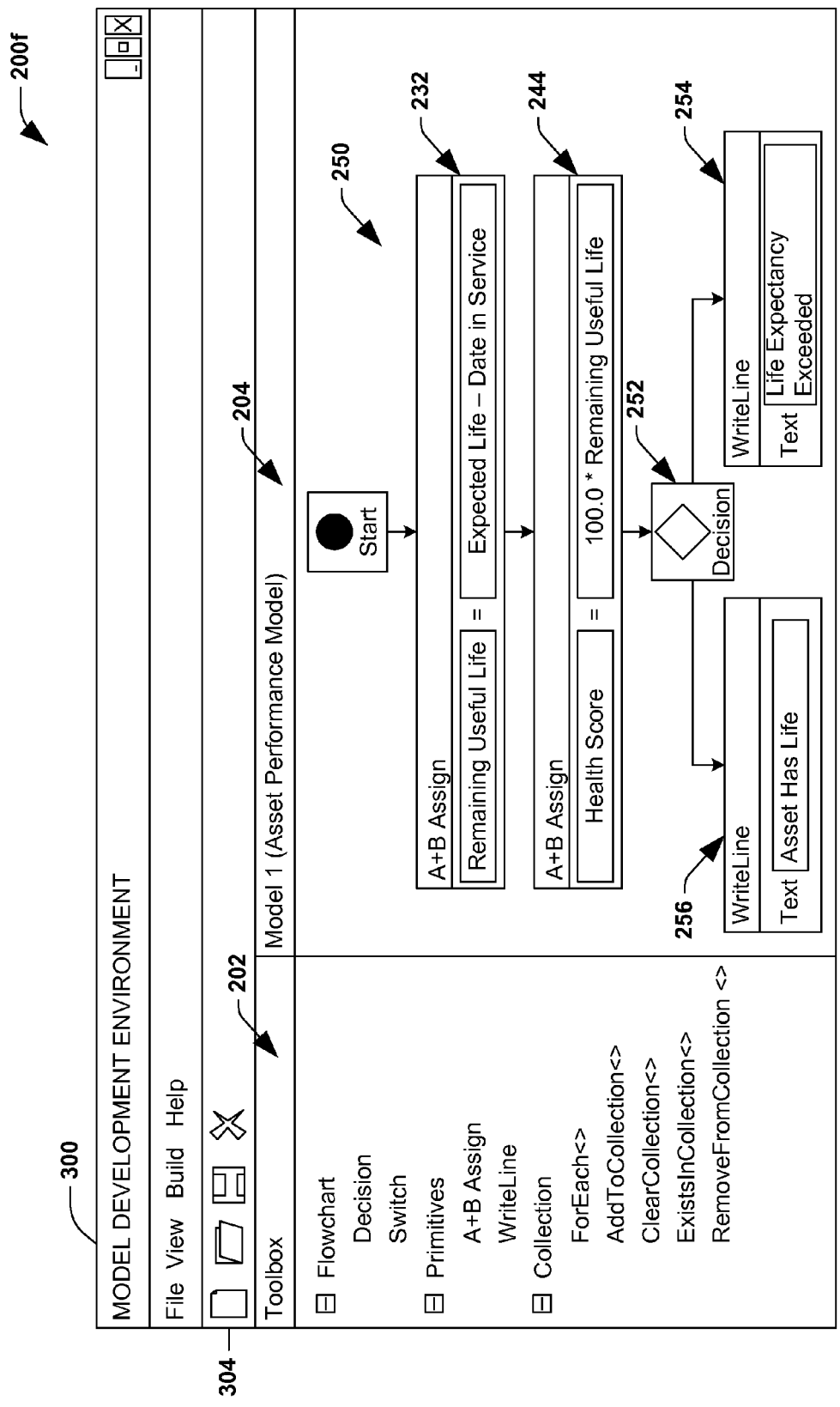
FIG. 7 illustrates an example graphical user interface of a model development environment.

Referring to FIG. 7, a graphical user interface 200f of the model development environment at a sixth state during the development of the model is illustrated. More particularly, the graphical user interface 200f illustrates a completed model 250 configured to describe whether an industrial asset has exceeded its life expectancy based upon a value of health score parameter output from the second node 244.

The model 250, represented in the model development portion 204 of the graphical user interface 200f, comprises a first node 232 configured to compute the remaining useful life of one or more industrial assets of interest based upon a first variable (e.g., expected life) and a second variable (e.g., date in service), where the first variable has been mapped to a first data store comprising data indicative of the expected lifespan of the one or more industrial assets of interest and the second variable has been mapped to a second data store comprising data indicative of the date respective industrial assets of interest were placed in service.

The model 250 also comprises a second node 244, which is linked to the first node 232, and is configured to compute a health score of one or more industrial assets of interest based upon a third variable (e.g., remaining useful life). Thus, the third variable, associated with the second output parameter (e.g., health score) is a function of a value of the first output parameter (e.g., remaining useful life).

The model 250 also comprises a logical decision node 252 configured to make a decision regarding whether a particular industrial asset has exceeded its life expectancy based upon the value of the second output parameter when data corresponding to the particular industrial asset is applied to the model 250. By way of example, a user may specify that the model 250 is to treat an industrial asset as having exceeded its life expectancy when the health score of the industrial asset is less than a defined threshold (e.g., 10 on a scale of 0-100, where 100 is very healthy). Accordingly, if the health score of the industrial asset is less than the defined threshold, the logical decision node 252 determines that the industrial asset has exceeded its life expectancy, and a first notation is made in a report by a first writeline node 254, the first notation indicating that the life expectancy of the industrial asset has been exceeded. If the health score of the industrial asset is greater than or equal to the defined threshold, the logical decision node 252 determines that the industrial asset still has life, and a second notation is made in the report by a second writeline node 256, the second notation indicating that the industrial asset still has life.

In some embodiments, the model development environment may provide for display of the properties portion 226 of the graphical user interface when the logical decision node 252, the first writeline node 254 and/or the second writeline node 256 are focused upon in the graphical user interface 200f. In this way, a user may view and/or modify one or more properties of the logical decision node 252, the first writeline node 254 and/or the second writeline node 256. For example, the user may view and/or modify a threshold that is utilized by the logical decision node 252 to make a decision regarding whether the industrial asset has exceeded its life expectancy. As another example, the user may view and/or modified the characters that are output by at least one of the first writeline node 254 and/or the second writeline node 256.

In still other embodiments, it may be desirable for one or more thresholds or other values within the model to be defined within the deployment environment (e.g., instead of defined by a user developing the model). By way of example, a first utility may prefer that industrial assets of a class of industrial assets to which the model pertains be identified as having exceeded their life expectancy when the health score is less than 10; a second utility may prefer that industrial assets of the class of industrial assets be identified as having exceeded their life expectancy when the health score is less than 15; and/or a third utility may prefer that industrial assets of the class of industrial assets be identified as having exceeded their life expectancy when the health score of the industrial asset is lower than 10 or in the bottom 5 percent of their current operating fleet. Accordingly, the threshold utilized by the logical decision node 252 to make a decision regarding whether the industrial asset has exceeded its life expectancy may be defined, within the model development environment, in terms of a variable instead of a value (e.g., defining the threshold as X instead of 10) and/or as a calculation involving statistics calculated on their fleet or across their industry, for example. In this way, when the model is deployed within a deployment environment, the utility may define X to be 10 or 15 and/or the model may automatically adapt to the condition of the utility's fleet, for example.

Figure 8:
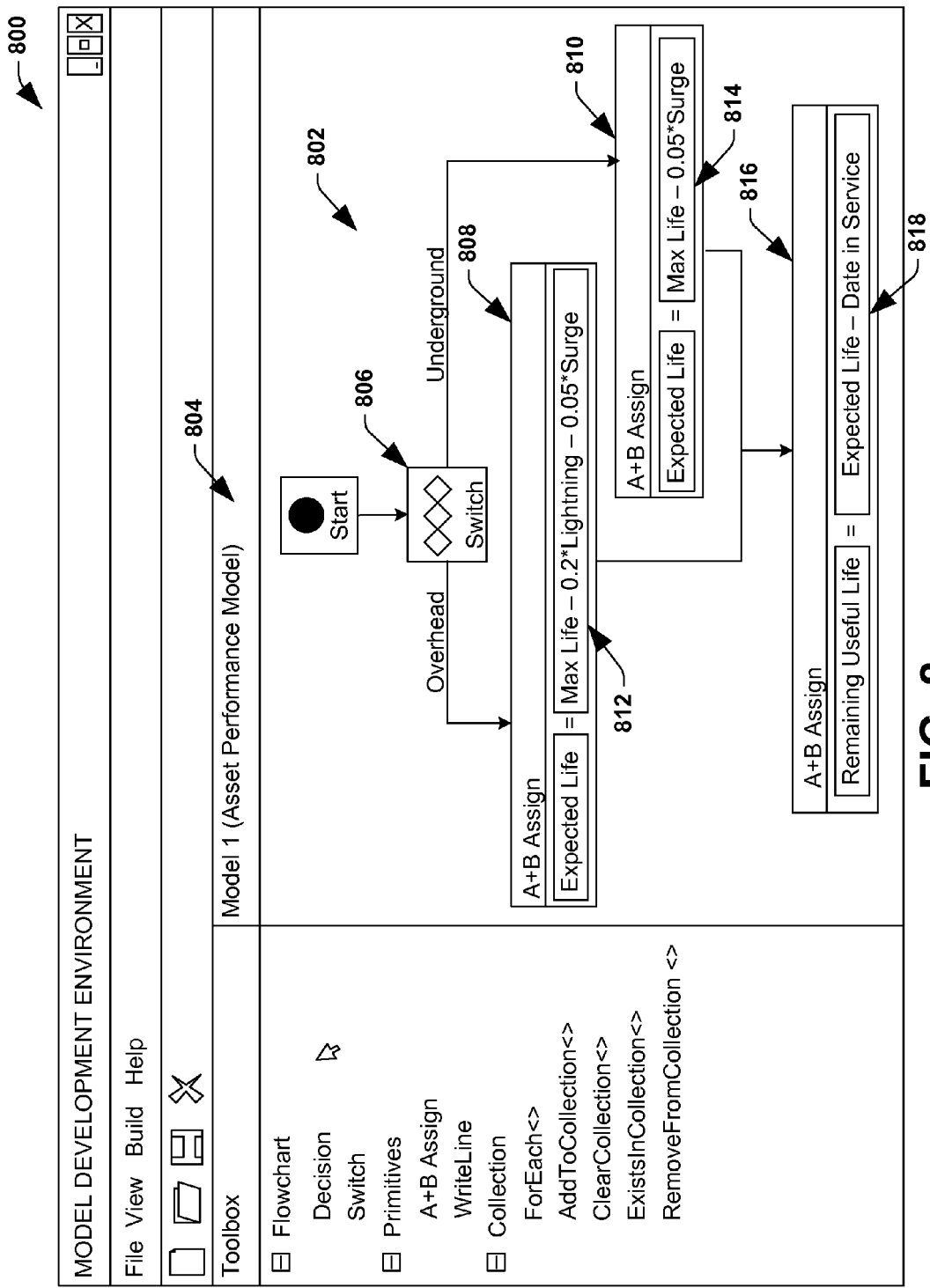
FIG. 8 illustrates an example graphical user interface of a model development environment.

Referring to FIG. 8, another graphical user interface 800 of a model development environment is illustrated. More particularly, the graphical user interface 800 illustrates a second completed model 802. The second completed model 802 is configured to calculate the remaining useful life of overhead power cables and underground power cables, where a first set of variables may influence the life cycle of overhead power cables and a second set of variables may influence the life cycle of underground power cables.

The model 802, represented in a model development portion 804 of the graphical user interface 800, comprises a logical switch node 806. The logical switch node 806 represents a function configured to determine whether an industrial asset to be analyzed is an overhead cable or an underground cable. Where the industrial asset is an overhead cable, a first function, represented by a first node 808, is configured to calculate the expected life. Where the industrial asset is an underground cable, a second function, represented by a second node 810, is configured to calculate the expected life.

The first node 808 comprises a first field 812 that facilitates entry of an equation and/or one or more variables for defining how an expected life parameter is to be calculated for overhead cables. For example, in the illustrated embodiment, a user has specified that an expected remaining useful life parameter is to be calculated by subtracting the product of 0.2 times the number of lightning strikes to the overhead cable from a max life of an overhead cable and by subtracting the product of 0.05 times the number of voltage surges experienced by the overhead cable from the max life (e.g., subtracting premature aging factors, such as lightning strikes and surges, from an average or expected max life of the industrial asset). By way of example, if an overhead cable has a max life of 40 years (e.g., based upon the type of cable, manufacturing specifications, etc.) and the overhead cable has experienced 2 lightning strikes and 10 power surges, the expected remaining useful life is 39.1 years (e.g., 40−0.2*2−0.05*10). As another example, degradation factors for lightning strikes (e.g., 0.2) or power surges (e.g., 0.05) may be provided as input variables and/or may be calculated directly in the model based on fleet analyses that considers historical data on similar cables.

The second node 810 comprises a second field 814 that facilitates entry of an equation and/or one or more variables for defining how an expected remaining useful life parameter is to be calculated for underground cables. For example, in the illustrated embodiment, a user has defined that an expected life parameter is to be calculated by subtracting the product of 0.05 times the number of voltage surges experienced by the overhead cable from the max life. By way of example, if an underground cable has a max life of 30 years and has experienced 20 power surges, the remaining useful life is 29.0 years (e.g., 30−0.05*20).

The model also comprises a third node 816, which is linked to the first node 808 and the second node 810. The third node comprises a third field 818 that facilitates entry of an equation and/or one or more variables for defining how the remaining useful life of a cable is to be calculated based upon a value of the expected life parameter calculated using a function represented by the first node 808 or the second node 810 (e.g., depending upon whether the cable being analyzed is an overhead cable or an underground cable). For example, in the illustrated embodiment, a user has defined the remaining useful life to be the difference between an expected life of the cable and the date the cable was placed in service. For example, if the underground cable has an expected life of 28.5 years and has been in service for 14.1 years, the remaining useful life would be 14.4 years (e.g., 28.5−14.1).

In some embodiments, the model development environment is further configured to execute or run the model (e.g., where variables used in the model have already been mapped to data sources comprising data associated with such variables). In this way, a user developing the model may test the model to verify that the model executes as designed, for example.

Figure 9:
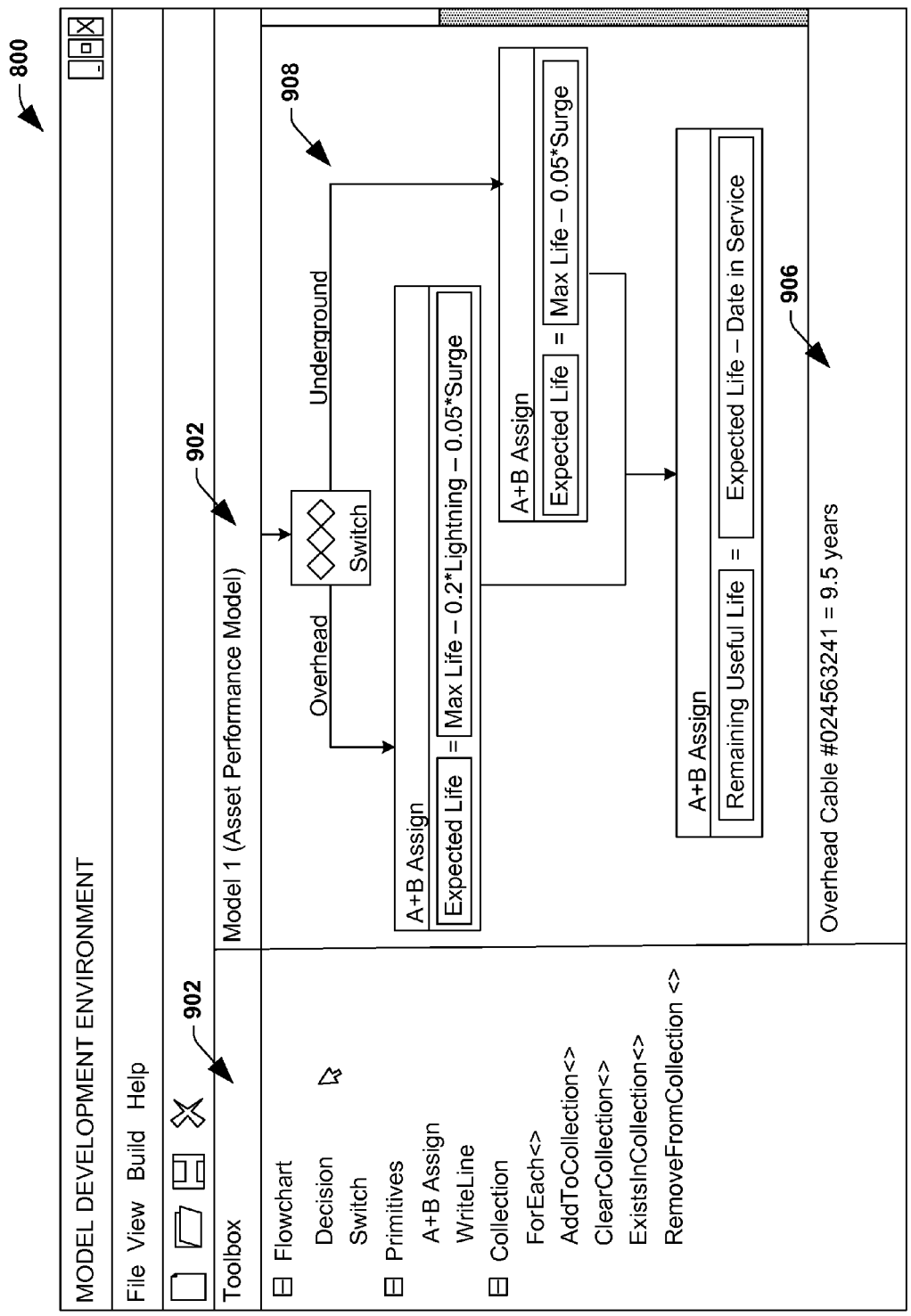
FIG. 9 illustrates an example graphical user interface of a model development environment.

FIG. 9 illustrates a graphical user interface 900 of the model development environment upon execution of a model 908. The graphical user interface 900 comprises a toolbox portion 902, a model development portion 904, and an output data portion 906 describing the results of execution. For example, in the illustrated embodiment, the model 908 has been executed to determine the remaining life of an overhead cable that is uniquely identified in the power system by the unique identifier 024563241. Using data indicative of the maximum life for a class of cables to which the overhead cable is a member, the number of lightning strikes recorded for the overhead cable, the number of voltage surges recorded for the overhead cable, and the date the overhead cable was placed into service, it has been calculated that the remaining useful life of the overhead cable is 9.5 years. Such a result is displayed to the user in the output data portion 906 of the example graphical user interface 900.

It may be appreciated that while the foregoing example describes using the model development environment to develop a flow-diagram model, such a model development environment may be used to develop other model design paradigms. By way of example, the model development environment may be configured to develop a travel curve model to predict when a switch will fail and/or to indicate when a switch is on the verge of failing. In such an embodiment, the user may define a rate of change of a voltage and/or current through the switch when the switch is switched between a first position (e.g., an off position) and a second position (e.g., an on position) as a first variable to the model. If the rate of change is within a desired threshold, the model may be configured to output an indication that the switch is healthy. If the rate of change is not within a desired threshold, the model may be configured to output an indication that the switch is unhealthy (e.g., on the verge of failure). As still another example, the model development environment may be used to develop a Bayesian Belief Network describing what the probability of one or more conditions is (e.g., such as a particular health condition) given one or more variables (e.g., ambient air temperature, core temperature, dissolved gas concentrations, structure fatigue measurements, corrosion measurements, etc.).

Figure 10:
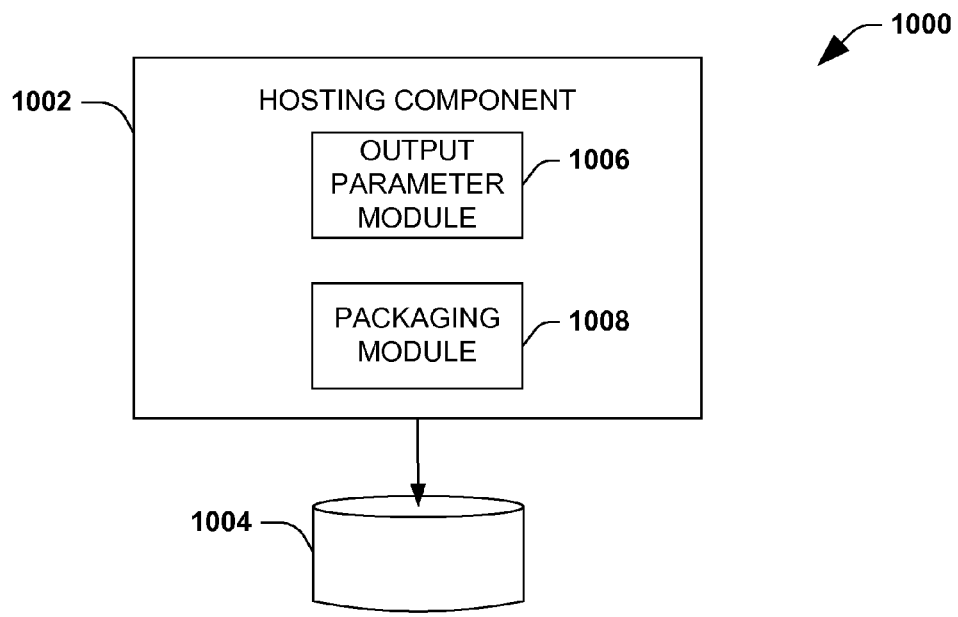
FIG. 10 is a component block diagram of an example system of a development environment for facilitating development, by a user, of a model describing a condition of an industrial asset.

FIG. 10 illustrates a component block diagram of a system 1000 of a development environment for facilitating development, by a user, of a model describing the health of an industrial asset. The system 1000 comprises a hosting component 1002 and a data store 1004 for storing one or more models in preparation for deployment within a deployment environment.

The hosting component 1002 is configured to host a model development environment configured to facilitate development, by a user, of a model describing the health of an industrial asset or a class(es) of industrial assets. In some embodiments, the hosting component 1002 comprises one or more modules configured to host various aspects of the model development environment. By way of example, the hosting component 1002 comprises an output parameter module 1006 and a packaging module 1008.

The output parameter module 1006 is configured to facilitate defining respective output parameters of a model being developed by associating one or more variables with respective output parameters and defining an argument type for respective output parameters. By way of example, the output parameter module 1006 may be configured to receive user input which may specify a type of model to be developed and/or an output parameter to be included within the model. Based upon such user input, the output parameter module 1006 may be configured to select an output parameter for incorporation into the model. Further, such an output parameter module 1006 may be configured to receive user input defining an output parameter selected for incorporation into the model. By way of example, the output parameter module 1006 may be configured to associate, based upon the user input, a first variable with the output parameter and/or may define, based upon user input, a first argument type for specifying how to compute a value of the output parameter based upon the first variable. In other embodiments, the first variable and/or first argument type may be defined by the output parameter module 1006 based upon a type of model being developed and/or the output parameter that is selected, for example.

The packaging module 1008 is configured to compile the model into a software package having a desired output package format (e.g., web service format and/or dynamic-link layer (DLL format), etc.) for use in a deployment environment. In some embodiments, the software package includes an application programming interface (API) for linking the variable(s) of the model with one or more data stores of a deployment environment where data associated with the variables is stored and/or for linking the output parameter(s) of the model with one or more data stores of the deployment environment where data output from the model is to be stored. In some embodiments, such an API also facilitates linking one or more variables to one or more preprocessing services configured to perform calculations, formatting, or other preprocessing procedures to prepare data for use by the model. In some embodiments, such an API also facilitates linking one or more output parameters to one or more post processing services configured to perform calculations, formatting, or other post processing procedures on data output from the model.

Figure 11:
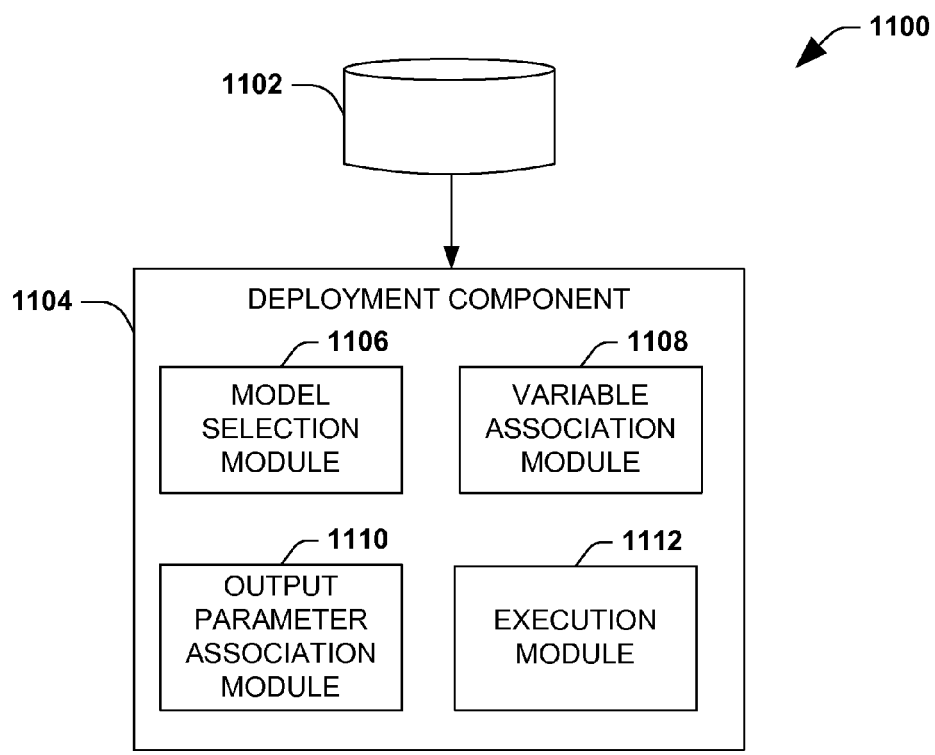
FIG. 11 is a component block diagram of an example system of a deployment environment for facilitating execution of one or more models

FIG. 11 illustrates a component block diagram of a system 1100 of a deployment environment for facilitating execution of one or more models, such as developed using a model development environment. The system 1100 comprises a data store 1102 (e.g., 1004 in FIG. 10) for storing one or more models in preparation for deployment within a deployment environment and a deployment component 1104 for deploying selected models within the development environment.

The deployment component 1104 comprises one or more modules for preparing selected models to be deployed and/or for executing selected models. By way of example, in the illustrated embodiment, the deployment component 1104 comprises a model selection module 1106, a variable association module 1108, an output parameter association module 1110, and an execution module 1112. The model selection module 1106 is configured to facilitate the selection of models for execution within the deployment environment. By way of example, a user may be interested in models for a particular class of transformer and may input information indicative of such an interest. Based upon the input, the model selection module 1106 may perform a search of the data store 1102 to identify models developed for the particular class of transformer and may provide for presentation a set of search results. The user may then select desired models from the search results for execution within the deployment environment.

The variable association module 1108 is configured to map respective variables of a selected model to a data store comprising data associated with the variable. By way of example, a first variable may relate to ambient air temperature and the variable association module 1108 may map the first variable to a data store comprising data indicative of ambient air temperature (e.g., mapping the first variable to a location where ambient air temperature data is stored for the particular deployment environment).

The output parameter association module 1110 is configured to map respective output parameters of a selected model to a data store where data output from the model is to be stored and/or further processed for the particular deployment environment. By way of example, a first output parameter may generate a health score for respective industrial assets of a class of industrial assets and the output parameter association module 1110 may map the first output parameter to a data store where health scores for the class of industrial assets are to be stored (e.g., mapping the first output parameter to a location where health score data is stored for the particular deployment environment).

The execution module 1112 is configured to execute a selected model within the development environment according to specified execution criteria. By way of example, a schedule may be devised for executing the model on a specified set of transformers every two weeks and the execution module 1112 may be configured to execute the model on the specified set of transformers according to the schedule. In other embodiments, other execution criteria describing when to execute a selected model may be defined, and the execution module 1112 may execute the selected model according to the criteria. In still other embodiments, the models may be executed based upon actions taken by a second user operating on an enterprise software application in which asset data is used. It may be appreciated that while the execution module 1112 is represented as an aspect of the deployment component 1104, in other embodiments, the environment in which the model selection module 1106 facilitates the selection of models, the variable association module 1108 maps respective variables to a data store and/or the output parameter association module 1110 maps respective output parameters may be different than an environment in which the execution module 1112 executes the model. By way of example, the variable association module 1108 and/or output parameter association module 1110 may operate in a sandbox environment while the execution module 1112 operates in a run-time environment (e.g., where user interaction with the execution module 1112 may be limited). Further, in some embodiments, multiple run-time environments (e.g., multiple enterprise application ecosystems) may utilize a same set of mappings for a model. For example, variables may be mapped to a respective data stores and/or output parameters may be mapped to respective data stores in a first environment and then the model (e.g., including the mappings) may be shipped to multiple enterprise application ecosystems, where the model may be executed by respective enterprises as desired.

Figure 12:
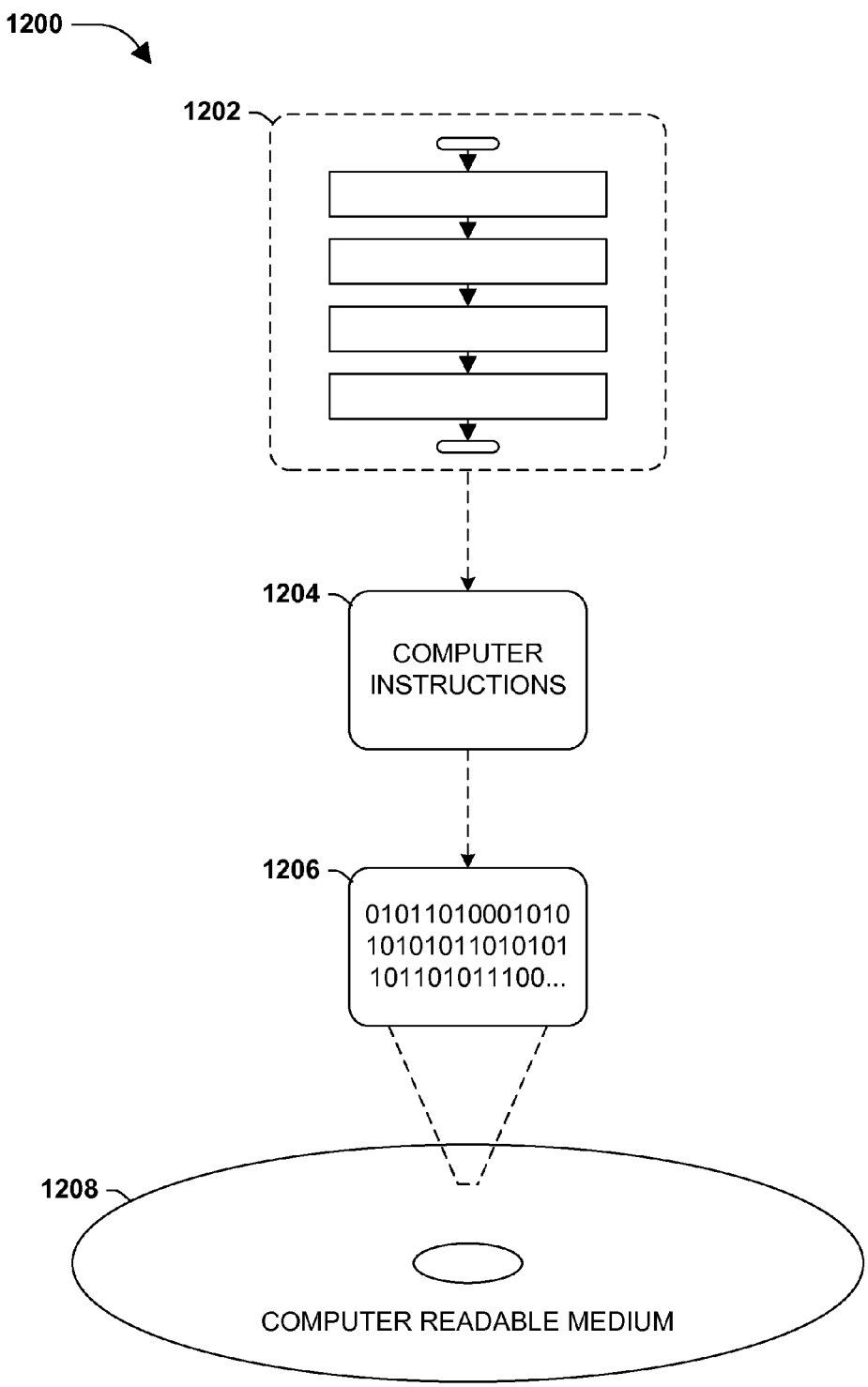
FIG. 12 is an illustration of an exemplary computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An example computer-readable medium that may be devised in these ways is illustrated in FIG. 12, wherein the implementation 1200 comprises a computer-readable medium 1208 (e.g., a flash drive, CD-R, DVD-R, application-specific integrated circuit (ASIC), field-programmable gate array (FPGA), a platter of a hard disk drive, etc.), on which is encoded computer-readable data 1206. This computer-readable data 1206 in turn comprises a set of processor-executable instructions 1204 that when executed via a processing unit(s) is configured to operate according to one or more of the principles set forth herein. In some embodiments, the processor-executable instructions 1204 may be configured to perform a method 1202, such as at least some of the example method 100 of FIG. 1, for example. In other embodiments, the processor-executable instructions 1204 may be configured to implement a system, such as at least some of the example system 1000 of FIG. 10 and/or at least some of the example system 1100 of FIG. 11, for example. Many such computer-readable media may be devised by those of ordinary skill in the art that are configured to operate in accordance with one or more of the techniques presented herein.

Figure 13:
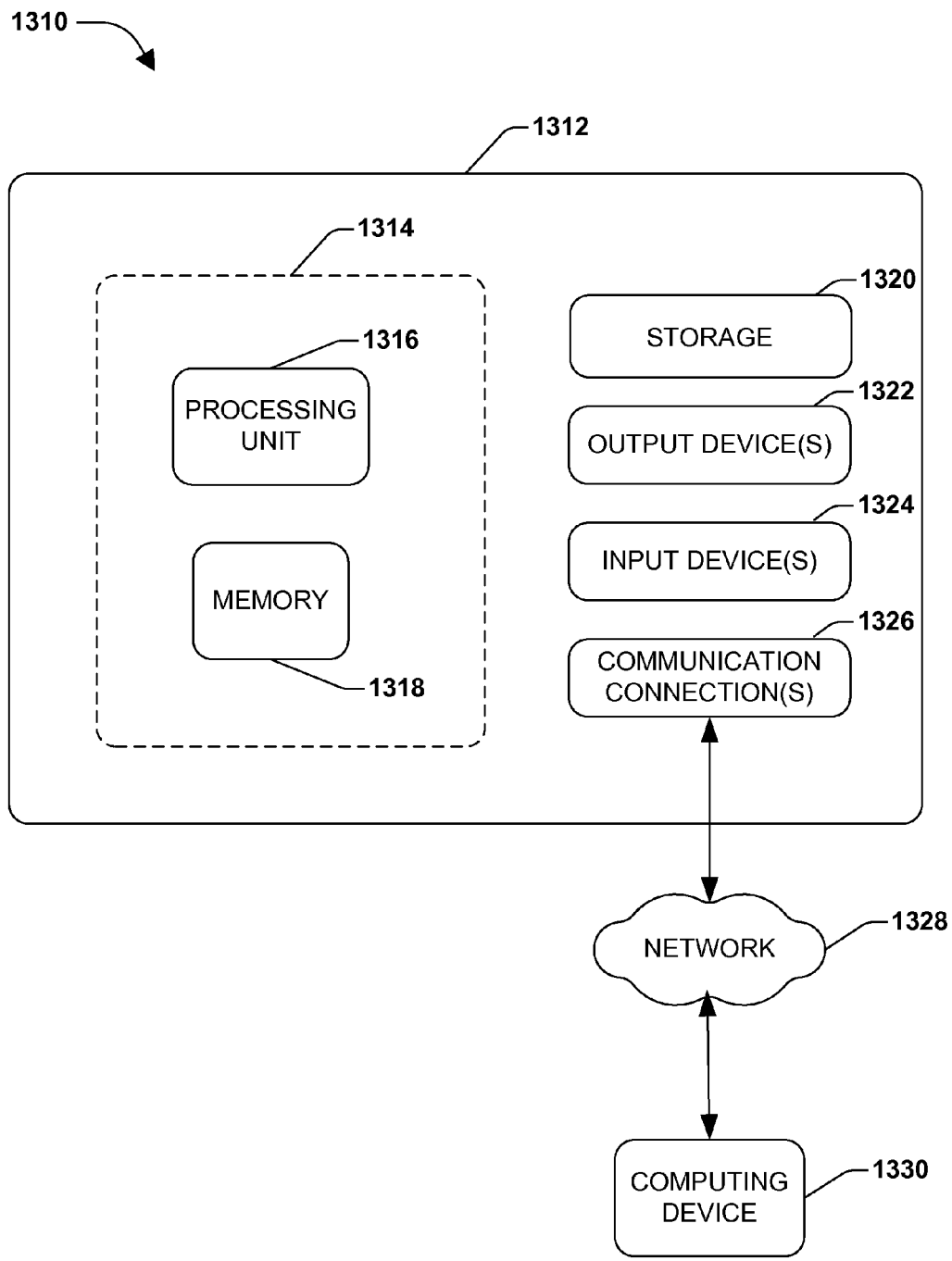
FIG. 13 illustrates an exemplary computing environment wherein one or more of the provisions set forth herein may be implemented.

FIG. 13 and the following discussion provide a brief, general description of a suitable computing environment to implement embodiments of one or more of the provisions set forth herein. The operating environment of FIG. 13 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 13 illustrates an example of a system 1310 comprising a computing device 1312 configured to implement one or more embodiments provided herein. In one configuration, computing device 1312 includes at least one processing unit 1316 and memory 1318. Depending on the exact configuration and type of computing device, memory 1318 may be volatile (such as RAM, for example), non-volatile (such as ROM, flash memory, etc., for example), or some combination of the two. This configuration is illustrated in FIG. 13 by dashed line 1314.

In other embodiments, device 1312 may include additional features and/or functionality. For example, device 1312 may also include additional storage (e.g., removable and/or non-removable) including, but not limited to, magnetic storage, optical storage, and the like. Such additional storage is illustrated in FIG. 13 by storage 1320. In one embodiment, computer readable instructions to implement one or more embodiments provided herein may be in storage 1320. Storage 1320 may also store other computer readable instructions to implement an operating system, an application program, and the like. Computer readable instructions may be loaded in memory 1318 for execution by processing unit 1316, for example.

The term "computer readable media" as used herein includes computer storage media. Computer storage media includes volatile and nonvolatile, removable and non-removable media implemented in any method or technology for storage of information such as computer readable instructions or other data. Memory 1318 and storage 1320 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1312. Any such computer storage media may be part of device 1312.

Device 1312 may also include communication connection(s) 1326 that allows device 1312 to communicate with other devices. Communication connection(s) 1326 may include, but is not limited to, a modem, a Network Interface Card (NIC), an integrated network interface, a radio frequency transmitter/receiver, an infrared port, a USB connection, or other interfaces for connecting computing device 1312 to other computing devices. Communication connection(s) 1326 may include a wired connection or a wireless connection. Communication connection(s) 1326 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 1312 may include input device(s) 1324 such as keyboard, mouse, pen, voice input device, touch input device, infrared cameras, video input devices, and/or any other input device. Output device(s) 1322 such as one or more displays, speakers, printers, and/or any other output device may also be included in device 1312. Input device(s) 1324 and output device(s) 1322 may be connected to device 1312 via a wired connection, wireless connection, or any combination thereof. In one embodiment, an input device or an output device from another computing device may be used as input device(s) 1324 or output device(s) 1322 for computing device 1312.

Components of computing device 1312 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 1312 may be interconnected by a network. For example, memory 1318 may be comprised of multiple physical memory units located in different physical locations interconnected by a network.

Those skilled in the art will realize that storage devices utilized to store computer readable instructions may be distributed across a network. For example, a computing device 1330 accessible via a network 1328 may store computer readable instructions to implement one or more embodiments provided herein. Computing device 1312 may access computing device 1330 and download a part or all of the computer readable instructions for execution. Alternatively, computing device 1312 may download pieces of the computer readable instructions, as needed, or some instructions may be executed at computing device 1312 and some at computing device 1330.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Further, unless specified otherwise, "first," "second," and/or the like are not intended to imply a temporal aspect, a spatial aspect, an ordering, etc. Rather, such terms are merely used as identifiers, names, etc. for features, elements, items, etc. (e.g., "a first channel and a second channel" generally corresponds to "channel A and channel B," where channel A and channel B may be two different channels, two identical channels, or the same channel.

Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. Similarly, illustrated ordering(s) of acts is not meant to be limiting, such that different orderings comprising the same or different (e.g., numbers) of acts are intended to fall within the scope of the instant disclosure. In addition, while a particular feature of the disclosure may have been disclosed with respect to only one of several implementations, such feature may be combined with one or more other features of the other implementations as may be desired and advantageous for any given or particular application.

What is claimed is:

1. A method for facilitating development, by a user and within a model development environment, of a model describing a condition of an industrial asset, comprising:
    defining a first output parameter of the model, the first output parameter describing the condition of the industrial asset, comprising:
    associating, in response to input from the user, a first variable with the first output parameter, the first variable associated with a first set of data comprising one or more values corresponding to the first variable, and the associating performed without the user identifying a first location where the first set of data is stored; and
    defining a first argument type that specifies how to compute the first output parameter based upon the first variable;
    defining a second output parameter of the model, the second output parameter describing the condition of the industrial asset, comprising:
    associating a second variable with the second output parameter; and
    defining a second argument type that specifies how to compute the second output parameter based upon the second variable; and
    linking the first output parameter to the second output parameter upon receipt of an indication by the user to make the second variable a function of the first output parameter, at least some of the method implemented via a processing unit.

2. The method of claim 1, at least one of the first variable or the second variable is associated with a first data store that stores data associated with one or more variables.

3. The method of claim 2, at least one of the first output parameter or the second output parameter is associated with a second data store that stores data associated with one or more output parameters.

4. The method of claim 1, comprising receiving an indication by the user to replace at least one of the first output parameter or the second output parameter with a third output parameter.

5. The method of claim 1, the receipt of an indication comprising:
    receiving the indication responsive to the user obscuring a portion of a first node associated with the first output parameter with a portion of a second node associated with the second output parameter.

6. The method of claim 1, comprising defining a type of model to be developed.

7. The method of claim 6, the defining a first output parameter comprising:
    defining the first output parameter based upon the type of model to be developed.

8. The method of claim 6, the defining a first argument type comprising:
    defining the first argument type based upon the type of model to be developed.

9. The method of claim 1, comprising:
    compiling the model into a software package having a specified output package format.

10. The method of claim 9, the output package format comprising at least one of a web service or a dynamic-link library.

11. The method of claim 1, comprising:
    executing the model within the model development environment.

12. A system comprising:
a hosting component configured to host a model development environment for developing a model, the hosting component comprising:
an output parameter module configured to facilitate defining one or more output parameters, describing a condition of an industrial asset of the model by:
associating, in response to input from the user, a first variable with the first output parameter, the first variable associated with a first set of data comprising one or more values corresponding to the first variable and the associating performed without the user identifying a first location where the first set of data is stored; and
defining a first argument type that specifies how to compute the first output parameter based upon the first variable;
associating a second variable with a second output parameter; and
defining a second argument type that specifies how to compute the second output parameter based upon the second variable; and
linking the first output parameter to the second output parameter upon receipt of an indication by the user to make the second variable a function of the first output parameter, at least some of the system implemented via a processing unit.

13. The system of claim 12, the industrial asset comprising power distribution equipment.

14. The system of claim 12, the hosting component comprising:
a packaging module configured to compile the model into a software package comprising an application programming interface (API) for linking the first variable to the first location to retrieve the first set of data.

15. The system of claim 14, the software package having at least one of a web service format or a dynamic-link library format.

16. The system of claim 12, comprising:
a variable association component configured to associate the first variable with the first set of data.

17. A non-transitory computer-readable medium having stored thereon processor-executable instructions that when executed cause performance of a method for facilitating development, by a user, of a model describing a condition of an industrial asset, the method comprising:
defining a first output parameter of the model, the first output parameter describing the condition of the industrial asset, comprising:
associating, in response to input from the user, a first variable with the first output parameter, the first variable associated with a first set of data; and
defining a first argument type that specifies how to compute the first output parameter based upon the first variable;
defining a second output parameter of the model, the second output parameter describing the condition of the industrial asset, comprising:
associating a second variable with the second output parameter; and
defining a second argument type that specifies how to compute the second output parameter based upon the second variable; and
linking the first output parameter to the second output parameter upon receipt of an indication by the user to make the second variable a function of the first output parameter.

18. The computer-readable medium of claim 17, the receipt of an indication comprising:
receiving the indication responsive to the user obscuring a portion of a first node associated with the first output parameter with a portion of a second node associated with the second output parameter.

19. The computer-readable medium of claim 17, the method comprising defining a type of model to be developed.

20. The computer-readable medium of claim 17, the method comprising:
compiling the model into a software package having a specified output package format.

* * * * *